(12) United States Patent
Okumura et al.

(10) Patent No.: US 11,387,040 B2
(45) Date of Patent: Jul. 12, 2022

(54) PRODUCING METHOD OF MODULE

(71) Applicant: NITTO DENKO CORPORATION, Ibaraki (JP)

(72) Inventors: Keisuke Okumura, Osaka (JP); Yoshihiro Furukawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 295 days.

(21) Appl. No.: 16/467,175

(22) PCT Filed: Nov. 16, 2017

(86) PCT No.: PCT/JP2017/041228
§ 371 (c)(1),
(2) Date: Jun. 6, 2019

(87) PCT Pub. No.: WO2018/105347
PCT Pub. Date: Jun. 14, 2018

(65) Prior Publication Data
US 2020/0075238 A1  Mar. 5, 2020

(30) Foreign Application Priority Data

Dec. 7, 2016 (JP) .............................. JP2016-237741
Nov. 6, 2017 (JP) .............................. JP2017-213829

(51) Int. Cl.
*H01F 41/04* (2006.01)
*H01F 1/28* (2006.01)
(Continued)

(52) U.S. Cl.
CPC ............. *H01F 41/046* (2013.01); *H01F 1/28* (2013.01); *H01F 17/0013* (2013.01);
(Continued)

(58) Field of Classification Search
CPC .......... H01F 41/046; H01F 1/28; H01F 1/165; H01F 17/0013; H01F 17/04; H01F 2017/0066; H05K 1/165; H05K 3/20
See application file for complete search history.

(56) References Cited

U.S. PATENT DOCUMENTS 4,959,631 A   9/1990 Hasegawa et al.
5,647,966 A * 7/1997 Uriu ...................... H01F 41/042
                                                     205/78
(Continued)

FOREIGN PATENT DOCUMENTS

CN        1406385 A        3/2003
CN        1515012 A        7/2004
(Continued)

OTHER PUBLICATIONS

Extended European Search Report dated Apr. 2, 2020, from the European Patent Office in application No. 17877412.1.
(Continued)

*Primary Examiner* — Jeffrey T Carley
(74) *Attorney, Agent, or Firm* — Sughrue Mion, PLLC

(57) ABSTRACT

A method for producing a module includes a first step of preparing a conductive layer disposed at one side in a thickness direction of a first peeling layer, a second step of forming a conductive pattern from the conductive layer, a third step of pushing the conductive pattern into a first adhesive layer containing a first magnetic particle and a first resin component, and a fourth step of peeling the first peeling layer.

15 Claims, 6 Drawing Sheets

(51) Int. Cl.
   *H01F 17/00*    (2006.01)
   *H01F 17/04*    (2006.01)
   *H05K 1/16*     (2006.01)
   *H05K 3/20*     (2006.01)

(52) U.S. Cl.
   CPC ............ *H01F 17/04* (2013.01); *H05K 1/165* (2013.01); *H05K 3/20* (2013.01); *H01F 2017/0066* (2013.01)

(56) References Cited

U.S. PATENT DOCUMENTS

| | | | |
|---|---|---|---|
| 6,136,127 A | 10/2000 | De Bastiani | |
| 9,984,805 B2* | 5/2018 | Kudo | H01F 17/04 |
| 10,002,694 B2* | 6/2018 | Wang | H01F 1/0302 |
| 2001/0023779 A1 | 9/2001 | Sugaya et al. | |
| 2002/0196119 A1 | 12/2002 | Meigs et al. | |
| 2003/0029830 A1* | 2/2003 | Takaya | H01F 41/041 216/13 |
| 2003/0102153 A1 | 6/2003 | Sugaya et al. | |
| 2006/0180342 A1* | 8/2006 | Takaya | H05K 1/165 174/256 |
| 2009/0090462 A1 | 4/2009 | Kato et al. | |
| 2011/0277321 A1* | 11/2011 | Inoue | H05K 3/20 29/846 |
| 2012/0131792 A1* | 5/2012 | Tseng | H01F 41/046 29/602.1 |
| 2013/0112463 A1 | 5/2013 | Seo et al. | |
| 2015/0302987 A1 | 10/2015 | Sano et al. | |
| 2016/0105969 A1* | 4/2016 | Habu | H05K 1/165 156/285 |
| 2017/0169930 A1* | 6/2017 | Kudo | H01F 17/04 |
| 2017/0271062 A1 | 9/2017 | Furukawa | |
| 2018/0192948 A1* | 7/2018 | Okumura | H05K 3/20 |

FOREIGN PATENT DOCUMENTS

| | | |
|---|---|---|
| CN | 102640577 A | 8/2012 |
| CN | 104756208 A | 7/2015 |
| CN | 105428035 A | 3/2016 |
| EP | 1 347 475 A1 | 9/2003 |
| EP | 2 963 094 A1 | 1/2016 |
| HK | 1041240 B | 5/2005 |
| JP | 1-318212 A | 12/1989 |
| JP | 4-171886 A | 6/1992 |
| JP | 5-63340 A | 3/1993 |
| JP | 8-162352 A | 6/1996 |
| JP | 2002-203719 A | 7/2002 |
| JP | 2002-204049 A | 7/2002 |
| JP | 2004-241538 A | 8/2004 |
| JP | 2007-81349 A | 3/2007 |
| JP | 2007-123940 A | 5/2007 |
| JP | 2008-166407 A | 7/2008 |
| JP | 2010-80569 A | 4/2010 |
| JP | 2015-201606 A | 11/2015 |
| JP | 2016-108561 A | 6/2016 |
| TW | 200704362 A | 1/2007 |

OTHER PUBLICATIONS

First Office Action dated Jan. 20, 2021 from the State Intellectual Property Office of P.R. China in Application No. 201780075916.5.
International Search Report for PCT/JP2017/041228 dated Feb. 6, 2018 [PCT/ISA/210].
Notification of Reasons for Refusal dated Jul. 6, 2021 by the Japanese Patent Office in application No. 2017-213829.
Second Office Action dated Oct. 20, 2021 by in China National Intellectual Property Administration in Chinese Application No. 201780075916.5.
Office Action dated Dec. 20, 2021 by the Taiwanese Intellectual Property Office in Taiwanese Application No. 106141320.
Desion of Refusal issued in CN Appln 201780075916.5 dated Apr. 6, 2022, with English translation.

* cited by examiner

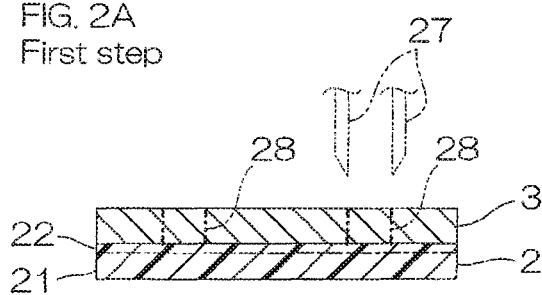
FIG. 2A
First step
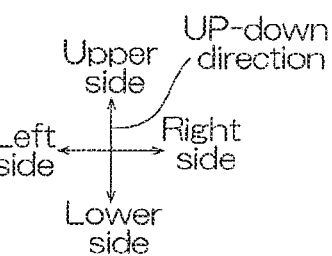
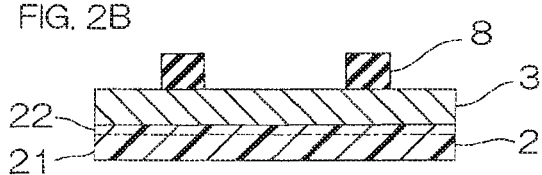
FIG. 2B
FIG. 2F
Fifth step
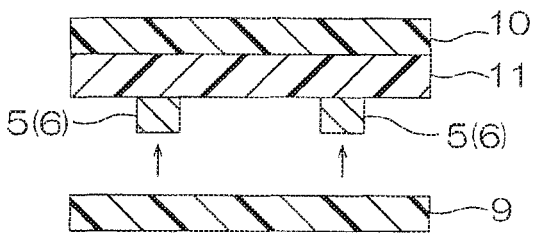
FIG. 2C
FIG. 2G
Sixth step
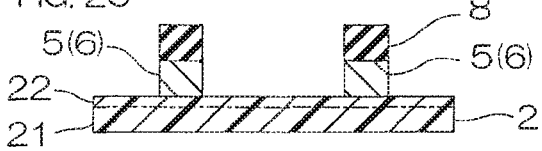
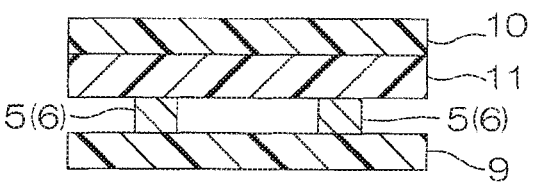
FIG. 2D
Second step
FIG. 2H
Third step (Fourth step)
Seventh and eighth steps
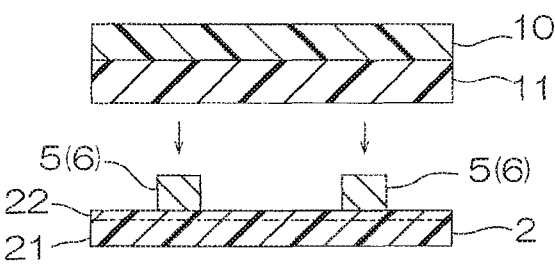
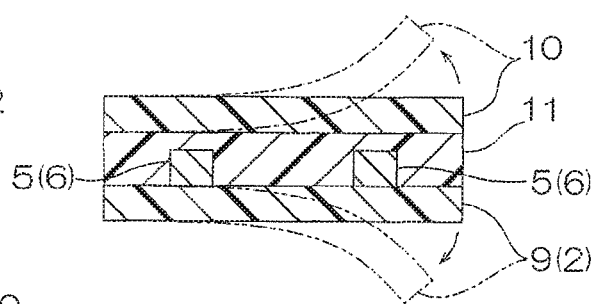
FIG. 2E
FIG. 2I (Ninth step)
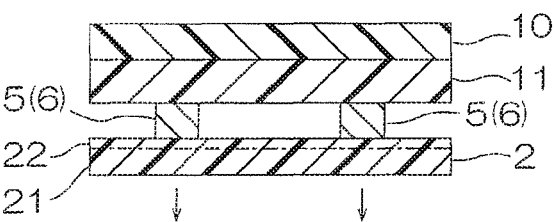
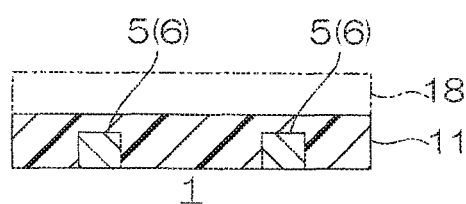

FIG. 4B Tenth step

FIG. 4D Twelfth step

FIG. 5B First step

FIG. 5D Second step

FIG. 5E Third step (Fourth step)

FIG. 6B Eleventh step

FIG. 6D Twelfth step

PRODUCING METHOD OF MODULE

CROSS REFERENCE TO RELATED APPLICATIONS

This application is a National Stage of International Application No. PCT/JP2017/041228, filed on Nov. 16, 2017, which claims priority from Japanese Patent Application No. 2016-237741, filed on Dec. 7, 2016 and Japanese Patent Application No. 2017-213829, filed on Nov. 6, 2017.

TECHNICAL FIELD

The present invention relates to a method for producing a module.

BACKGROUND ART

Conventionally, it has been known that a module that combines a coil with a magnetic material is used in wireless power transmission (wireless power feeding), wireless communication, a passive component, or the like. As a method for producing a module, a method in which an electrically conductive layer that is a coil pattern, an insulating layer that covers the electrically conductive layer, and an upper magnetic layer are sequentially formed on a ferrite board has been known (ref: for example, Patent Document 1).

The insulating layer described in Patent Document 1 fills a space between the coil patterns that are next to each other. In Patent Document 1, the upper magnetic layer faces the electrically conductive layer via the insulating layer.

In the method described in Patent Document 1, in order to form the electrically conductive layer, first, a seed layer is formed on the upper surface of the ferrite board, next, a resist pattern is formed on the upper surface of the seed layer, and thereafter, the electrically conductive layer is formed on the upper surface of the coil pattern by copper plating in which an electric power is supplied from the seed layer (additive method).

CITATION LIST

Patent Document

Patent Document 1: Japanese Unexamined Patent Publication No. 2007-81349

BRIEF SUMMARY OF THE INVENTION

Recently, the thinning of various modules has been required. However, there is a disadvantage that an inductor obtained by the method described in Patent Document 1 includes the ferrite board, so that the above-described demand cannot be satisfied.

In the inductor obtained by the method described in Patent Document 1, there is a disadvantage that the upper magnetic layer faces the electrically conductive layer via the insulating layer, so that the above-described demand cannot be satisfied, and additionally, high inductance cannot be ensured.

Furthermore, in the additive method described in Patent Document 1, there is a disadvantage that the copper plating takes time, so that the electrically conductive layer cannot be formed for a short period of time and thus, the production efficiency is reduced.

An object of the present invention is to provide a method for producing a module that is capable of efficiently producing a module which can ensure high inductance, while the thinning thereof is achieved.

A first embodiment includes a method for producing a module including a first step of preparing a conductive layer disposed at one side in a thickness direction of a first peeling layer, a second step of forming a conductive pattern from the conductive layer, a third step of pushing the conductive pattern into a first adhesive layer containing a first magnetic particle and a first resin component, and a fourth step of peeling the first peeling layer.

According to the method for producing a module, a module without including the ferrite board such as that in Patent Document 1 can be produced. Thus, a thin module can be produced.

In the third step of the method for producing a module, the conductive pattern is pushed into the first adhesive layer containing the first magnetic particle, so that the high inductance can be ensured, while further thinning of the module can be achieved.

Furthermore, in the second step of the method for producing a module, the conductive pattern can be formed from the conductive layer for a short period of time with respect to the method described in Patent Document 1 using plating.

A second embodiment includes the method for producing a module described in the first embodiment, wherein in the first step, the conductive layer disposed at a one-side surface in the thickness direction of the first peeling layer is prepared, and in the fourth step, the first peeling layer is peeled from the conductive layer.

According to the method for producing a module, the first peeling layer is peeled from the conductive layer, so that the conductive layer can be surely exposed.

A third embodiment includes the method for producing a module described in the first or second embodiments, wherein in the first step, the conductive layer is prepared in the pressure-sensitive adhesive first peeling layer, and the third step includes a fifth step of transferring the conductive pattern from the first peeling layer onto the one-side surface in the thickness direction of the first adhesive layer, a sixth step of disposing a second peeling layer having a lower pressure-sensitive adhesive force with respect to the first adhesive layer than that of the first peeling layer with respect to the first adhesive layer on the one-side surface in the thickness direction of the conductive pattern, a seventh step of press-bonding the second peeling layer with respect to the first adhesive layer to push the conductive pattern into the first adhesive layer, and an eighth step of peeling the second peeling layer.

In the third step, when the conductive pattern that is supported by the first peeling layer is pushed into the first adhesive layer, unintentionally, the pressure-sensitive adhesive first peeling layer pressure-sensitively adheres to the first adhesive layer and thereafter, the first peeling layer may not be easily peeled from the first adhesive layer.

However, according to the method for producing a module, in the fifth step, the conductive pattern is transferred from the first peeling layer onto the one-side surface in the thickness direction of the first adhesive layer, and in the sixth step, the second peeling layer having a lower pressure-sensitive adhesive force with respect to the first adhesive layer than that of first peeling layer with respect to the first adhesive layer is disposed on the one-side surface in the thickness direction of the conductive pattern. Then, in the seventh step, when the second peeling layer is press-bonded to the first adhesive layer, the conductive pattern can be pushed into the first adhesive layer, while the pressure-sensitive adhesion of the second peeling layer with respect to the first adhesive layer is suppressed.

Then, in the eighth step, the second peeling layer can be easily and surely peeled from the first adhesive layer.

A fourth embodiment includes the method for producing a module described in the first embodiment, wherein in the first step, the conductive layer is laminated in the first peeling layer via a supporting layer, and in the fourth step, the first peeling layer is peeled from the supporting layer.

According to the method for producing a module, in the first step, the conductive layer is laminated in the first peeling layer via the supporting layer, so that in the third step, the conductive pattern can be pushed into the first adhesive layer, while supported by the supporting layer. Thus, in the third step, when the conductive pattern is pushed into the first adhesive layer, even though a stress is imparted from the first adhesive layer to the conductive pattern, the position displacement of the conductive pattern can be suppressed, and the position accuracy of the conductive pattern can be improved. As a result, a module having desired inductance can be produced.

In the fourth step, the first peeling layer is peeled from the supporting layer, so that the supporting layer can be surely exposed.

A fifth embodiment includes the method for producing a module described in any one of the first to the fourth embodiments, wherein in the second step, the conductive layer is etched.

According to the method for producing a module, in the second step, the conductive layer is etched, so that the conductive pattern can be formed in a shorter period of time compared to the plating described in Patent Document 1.

A sixth embodiment includes the method for producing a module described in any one of the first to the fifth embodiments, wherein the content ratio of the first magnetic particle in the first adhesive layer is 15 volume % or more and 60 volume % or less.

According to the method for producing a module, the content ratio of the first magnetic particle in the first adhesive layer is 15 volume % or more, so that the improvement of the inductance can be achieved. Also, the content ratio of the first magnetic particle in the first adhesive layer is 60 volume % or less, so that the push-in of the conductive pattern with respect to the first adhesive layer can be surely performed. Thus, both of the improvement of the inductance and the improvement of the push-in properties of the conductive pattern with respect to the first adhesive layer can be achieved.

A seventh embodiment includes the method for producing a module described in any one of the first to the sixth embodiments, wherein the first resin component is an epoxy resin, a phenol resin, and an acrylic resin.

According to the method for producing a module, the first resin component is the epoxy resin, the phenol resin, and the acrylic resin, so that in the third step, the conductive pattern can be surely pushed into the first adhesive layer, and a module having excellent flexibility and excellent heat resistance can be produced.

an eighth embodiment includes the method for producing a module described in any one of the first to the seven embodiments further including a ninth step of disposing a magnetic layer containing a second magnetic particle and a second resin component at the other-side surface in the thickness direction of the first adhesive layer.

According to the method for producing a module, in the ninth step, the magnetic layer is disposed at the other-side surface in the thickness direction of the first adhesive layer, so that the inductance of the module can be further more improved.

A ninth embodiment includes the method for producing a module described in any one of the first to the third embodiments further including a tenth step of forming an adhesive layer including the first adhesive layer and the second adhesive layer and embedding the conductive pattern by covering the one-side surface in the thickness direction of the conductive pattern with the second adhesive layer containing the first magnetic particle, wherein the third step is performed so that the one-side surface in the thickness direction of the conductive pattern is exposed from the first adhesive layer.

According to the method for producing a module, in the tenth step, the adhesive layer that embeds the conductive pattern is formed, so that the inductance of the module can be further more improved.

A tenth embodiment includes the method for producing a module described in the fourth embodiment further including an eleventh step of forming an adhesive layer including the first adhesive layer and the second adhesive layer, and sandwiching the conductive pattern and the supporting layer in the thickness direction therebetween by covering the one-side surface in the thickness direction of the supporting layer with the second adhesive layer containing the first magnetic particle, wherein the third step is performed so that the one-side surface in the thickness direction of the supporting layer is exposed.

According to the method for producing a module, in the eleventh step, the adhesive layer that sandwiches the conductive pattern and the supporting layer therebetween is formed, so that the inductance of the module can be further more improved, while the position accuracy of the conductive pattern is improved.

An eleventh embodiment includes the method for producing a module described in the tenth embodiment, wherein the content ratio of the first magnetic particle in the adhesive layer is 15 volume % or more and 60 volume % or less.

According to the method for producing a module, the content ratio of the first magnetic particle in the adhesive layer is 15 volume % or more, so that the improvement of the inductance can be achieved. Also, the content ratio of the first magnetic particle in the adhesive layer is 60 volume % or less, so that the embedding of the conductive pattern with respect to the adhesive layer can be surely performed. Thus, both of the improvement of the inductance and the embedding properties of the adhesive layer with respect to the conductive pattern can be achieved.

A twelfth embodiment includes the method for producing a module described in any one of the first to the eleventh embodiments, wherein the first magnetic particle is a particle consisting of at least one kind selected from iron and iron alloy.

According to the method for producing a module, the first magnetic particle is a particle consisting of at least one kind selected from iron and iron alloy, so that the inductance can be surely improved.

A thirteenth embodiment includes the method for producing a module described in any one of the tenth to the twelfth embodiments further including a twelfth step of disposing the magnetic layer containing the second magnetic particle and the second resin component at the one-side surface and the other-side surface in the thickness direction of the adhesive layer.

According to the method for producing a module, in the twelfth step, the magnetic layer is disposed at the one-side surface and the other-side surface in the thickness direction of the adhesive layer, so that the inductance of the module can be further more improved.

A fourteenth embodiment includes the method for producing a module described in the eighth embodiment or the thirteen embodiment, wherein the content ratio of the second magnetic particle in the magnetic layer is 40 volume % or more.

According to the method for producing a module, the content ratio of the second magnetic particle in the magnetic layer is high of 40 volume % or more, so that the improvement of the inductance can be further more achieved by the magnetic layer.

A fifteenth embodiment includes the method for producing a module described in any one of the eighth embodiment, the thirteenth embodiment, and the fourteenth embodiment, wherein the second magnetic particle is a particle consisting of at least one kind selected from iron and iron alloy.

According to the method for producing a module, the second magnetic particle is a particle consisting of at least one kind selected from iron and iron alloy, so that the inductance can be surely improved.

A sixteenth embodiment includes the method for producing a module described in any one of the eight embodiment and the thirteenth to the fifteen embodiments, wherein the second resin component is an epoxy resin, a phenol resin, and an acrylic resin.

According to the method for producing a module, a module having excellent flexibility and excellent heat resistance can be produced.

According to the method for producing a module of the present invention, high inductance is ensured, while the thinning of the module is achieved, and the conductive pattern can be formed for a short period of time.

BRIEF DESCRIPTION OF THE DRAWINGS

FIGS. 2A to 2I show production process views of a method for producing a first module that is the first embodiment of the method for producing a module of the present invention:

FIG. 2A illustrating a first step of preparing a conductive layer disposed on a first peeling layer.

FIG. 2B illustrating a step of disposing an etching resist,

FIG. 2C illustrating a step of etching the conductive layer,

FIG. 2D illustrating a second step of removing the etching resist and forming a coil pattern, FIG. 2E illustrating a step of bringing a first adhesive layer into contact with the coil pattern, FIG. 2F illustrating a fifth step of transferring the coil pattern from the first peeling layer onto the first adhesive layer.

FIG. 2G illustrating a sixth step of disposing a second peeling layer on the lower surface of the coil pattern, FIG. 2H illustrating a third step (fourth step, seventh step, and eighth step) (cross-sectional view along an A-A line of FIG. 1) of pushing the coil pattern into the first adhesive layer, and FIG. 2I illustrating a step of producing the first module including the first adhesive layer and the coil pattern.

FIGS. 4A to 4D show production process views of a method for producing a second module that is the second embodiment of the method for producing a module of the present invention:

FIG. 4A illustrating a step of preparing a second adhesive layer disposed on a third peeling layer, FIG. 4B illustrating a tenth step of covering a coil pattern with the second adhesive layer and embedding the coil pattern by an adhesive layer, FIG. 4C illustrating a step of preparing two magnetic layers, and FIG. 4D illustrating a twelfth step of disposing the magnetic layers on the adhesive layer.

FIGS. 5A to 5F show production process views of a method for producing a third module that is a third embodiment of the method for producing a module of the present invention:

FIG. 5A illustrating a step of preparing a two-layer substrate consisting of a conducive layer and a supporting layer, FIG. 5B illustrating a first step of attaching a first peeling layer to the two-layer substrate, FIG. 5C illustrating a step of disposing an etching resist.

FIG. 5D illustrating a second step of etching the conductive layer and forming a coil pattern, FIG. 5E illustrating a third step of pushing the coil pattern into a first adhesive layer, and a fourth step of peeling the first peeling layer, and FIG. 5F illustrating a ninth step of further providing a magnetic layer.

FIGS. 6A to 6D show production process views of a method for producing a fourth module that is a fourth embodiment of the method for producing a module of the present invention:

FIG. 6A illustrating a step of preparing a second adhesive layer disposed on a third peeling layer.

FIG. 6B illustrating an eleventh step of covering a supporting layer with the second adhesive layer, and sandwiching a coil pattern and the supporting layer in an adhesive layer.

FIG. 6C illustrating a step of preparing two magnetic layers, and

FIG. 6D illustrating a twelfth step of disposing the magnetic layers on the adhesive layer.

DESCRIPTION OF EMBODIMENTS

In FIGS. 2A to 2I, the up-down direction on the plane of the sheet is an up-down direction (one example of a thickness direction, first direction), the upper side on the plane of the sheet is an upper side (one side in the thickness direction, one side in the first direction), and the lower side on the plane of the sheet is a lower side (the other side in the thickness direction, the other side in the first direction).

In FIG. 1, and FIGS. 2A to 2I, the right-left direction on the plane of the sheet is a right-left direction (second direction perpendicular to the first direction, width direction), the right side on the plane of the sheet is a right side (one side in the width direction, one side in the second direction), and the left side on the plane of the sheet is a left side (the other side in the width direction, the other side in the second direction).

Figure 1:
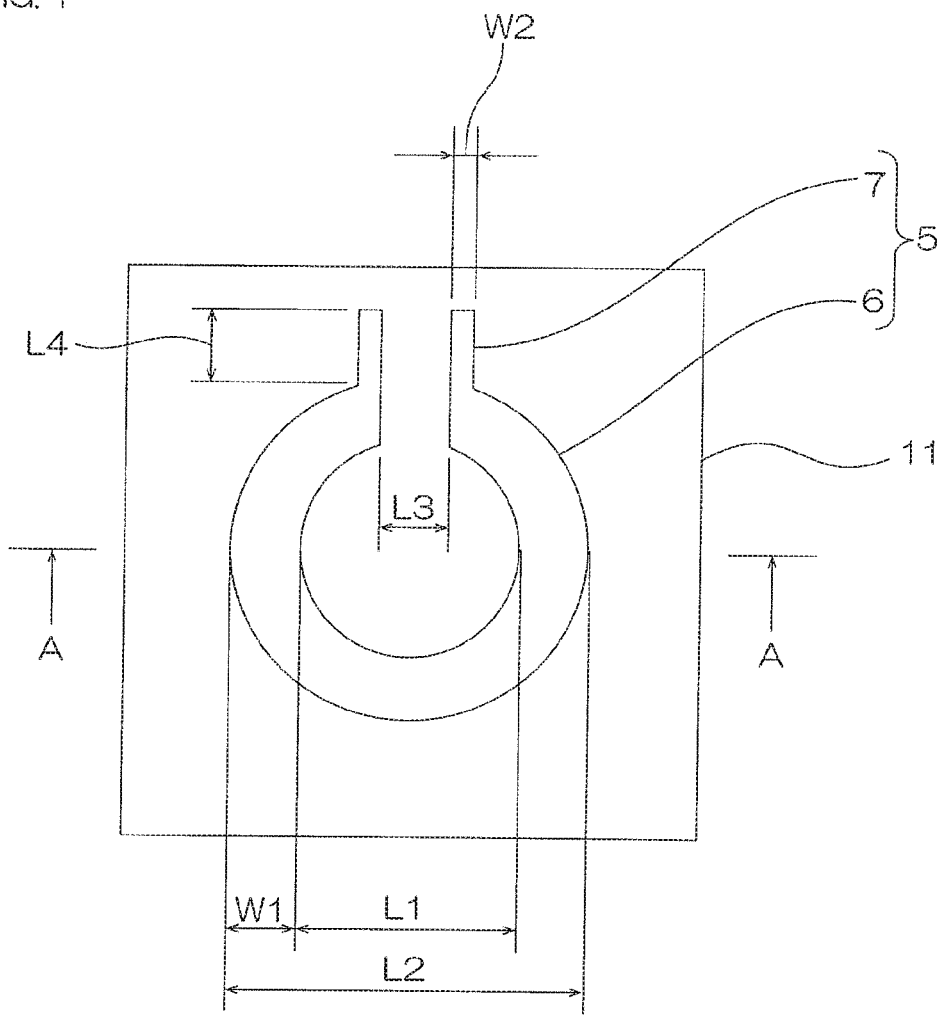
FIG. 1 shows a bottom view of a first module obtained by a first embodiment of a method for producing a module of the present invention.
Figure 1:
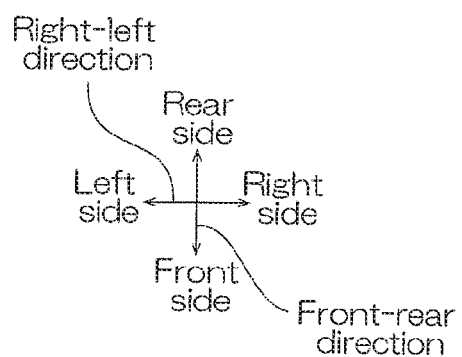

Meanwhile, in FIG. 1, the up-down direction on the plane of the sheet is a front-rear direction (third direction perpendicular to the first direction and the second direction), the lower side on the plane of the sheet is a front side (one side in the third direction), and the upper side on the plane of the sheet is a rear side (the other side in the third direction).

To be specific, directions are in conformity with direction arrows of each view.

First Embodiment

1. Method for Producing First Module

A method for producing a first module 1 that is a first embodiment of a method for producing a module of the present invention is described with reference to FIG. 1, and FIGS. 2A to 2I.

The method for producing the first module 1 includes a first step (ref: FIG. 2A) of preparing a conductive layer 3 that is disposed on a first peeling layer 2, a second step (ref: FIG. 2D) of forming a coil pattern 5 as one example of a conductive pattern from the conductive layer 3, a third step (ref: FIG. 2H) of pushing the coil pattern 5 into a first adhesive layer 11 containing a first magnetic particle and a first resin component, and a fourth step (ref: arrow of FIG. 2H) of peeling the first peeling layer 2. The first step to the fourth step are sequentially performed in this order. Hereinafter, each step is sequentially described.

2. First Step

As shown in FIG. 2A, in the first step, the conductive layer 3 that is disposed on the upper surface (one example of a one-side surface in the thickness direction) of the first peeling layer 2 is prepared.

The first peeling layer 2 has a generally flat plate (sheet) shape extending in a plane direction that is perpendicular to the thickness direction (the front-rear direction and the right-left direction in FIG. 1). The first peeling layer 2 is a supporting layer that supports the conductive layer 3 during the formation of the coil pattern 3 by trimming the conductive layer 3. The first peeling layer 2 is also a transfer substrate (peeling layer) for transferring the coil pattern 5 onto the first adhesive layer 11 (ref: FIG. 2D).

The first peeling layer 2 preferably has pressure-sensitive adhesive properties (tackiness). To be specific, the first peeling layer 2 includes a pressure-sensitive adhesive layer (pressure-sensitive adhesion layer) 22 and a supporting board 21 that supports the pressure-sensitive adhesive layer 22.

The pressure-sensitive adhesive layer 22 is, for example, formed from a pressure-sensitive adhesive such as acrylic pressure-sensitive adhesive into a sheet shape. The thickness of the pressure-sensitive adhesive layer 22 is, for example, 0.1 μm or more, preferably 1 μm or more, and for example, 100 μm or less, preferably 10 μm or less.

The supporting board 21 is, for example, formed from a polymeric material such as polyethylene terephthalate sheet (PET) into a flexible sheet shape. The supporting board 21 is disposed on the lower surface of the pressure-sensitive adhesive layer 22, and supports the pressure-sensitive adhesive layer 22. The supporting board 21 may be a metal foil, a ceramic sheet, or the like. The thickness of the supporting board 21 is, for example, 1 μm or more, preferably 10 μm or more, and for example, 1000 μm or less, preferably 100 μm or less. The ratio of the thickness of the supporting board 21 to that of the pressure-sensitive adhesive layer 22 is, for example, 0.01 or more, preferably 0.05 or more, and for example, 10 or less, preferably 1 or less.

The conductive layer 3 has a generally flat plate (sheet) shape extending in the plane direction. The conductive layer 3 is not the coil pattern 5 (ref. FIG. 2D), and a coil preparation body for forming the coil pattern 5. That is, the conductive layer 3 does not have a coil portion 6 and a terminal portion 7 (described later, ref: FIG. 1) provided in the coil pattern 5 yet.

The conductive layer 3 is in contact with the upper surface of the first peeling layer 2. To be more specific, the conductive layer 3 pressure-sensitively adheres (is attached) to the entire upper surface of the pressure-sensitive adhesive layer 22 in the first peeling layer 2.

Examples of a material that forms the conductive layer 3 include conductors such as copper, nickel, gold, silver, aluminum, tungsten, solder, and an alloy thereof preferably, copper is used.

The thickness of the conductive layer 3 is, for example, 1 μm or more, preferably 5 μm or more, and in view of resistance reduction of the conductive layer 3, preferably 30 μm or more. The thickness of the conductive layer 3 is, for example, 200 μm or less, preferably 10 μm or less, and in view of thinning of the first module 1, preferably 70 μm or less.

To prepare the conductive layer 3, the conductive layer 3 is disposed on the upper surface of the first peeling layer 2. To be more specific, the conductive layer 3 pressure-sensitively adheres (is attached) to the upper surface of the pressure-sensitive adhesive layer 22 in the first peeling layer 2.

Alternatively, a laminate including the conductive layer 3 and the first peeling layer 2 can be also prepared in advance.

3. Second Step

As shown in FIG. 2D, in the second step, the coil pattern 5 is formed from the conductive layer 3. For example, the conductive layer 3 is trimmed, and the coil pattern 5 is formed. To be specific, the coil pattern 5 is formed by a subtractive method.

As shown in FIG. 2B, in the subtractive method, an etching resist 8 is disposed on the upper surface of the conductive layer 3. For example, first, a photo resist such as a dry film resist having a sheet shape is disposed on the entire upper surface of the conductive layer 3, and next, the etching resist 8 having the same pattern as that of the coil pattern 5 (ref: FIG. 1) is formed by photo processing.

As shown in FIG. 2C, next, the conductive layer 3 that is exposed from the etching resist 8 is removed by etching. Examples of the etching include wet etching and dry etching. In view of productivity and low cost, preferably, wet etching is used. In the wet etching, the first peeling layer 2, the conductive layer 3, and the etching resist 8 are immersed in an etching solution. The etching solution is not particularly limited as long as it is a solution that is capable of etching a conductor. Examples thereof include ferric chloride solution, and liquid mixture of sulfuric acid and hydrogen peroxide. The etching time is, for example, 20 seconds or more, preferably 30 seconds or more, and for example, 5 minutes or less, preferably 3 minutes or less.

In this manner, the coil pattern 5 is formed.

Thereafter, as shown in FIG. 2D, the etching resist 8 is removed. For example, the etching resist 8 is peeled with a peeling liquid.

In this manner, the coil pattern 5 that is disposed on the upper surface of the first peeling layer 2 is obtained.

As shown in FIG. 1, the coil pattern 5 continuously has the coil portion 6 and the terminal portion 7.

The coil portion 6 has a generally circular ring shape in which the rear end portion thereof is cut out when viewed from the top or a generally rectangular frame shape when viewed from the top. To be specific, for example, the coil portion 6 has a generally C-shape in which the rear side thereof is open when viewed from the top.

The terminal portion 7 has a generally linear shape extending rearwardly from each of the two rear end portions of the coil pattern 5 when viewed from the top.

The size of the coil pattern 5 is not particularly limited. A width W1 of the coil portion 6 is, for example, 20 μm or more, preferably 50 μm or more, and for example, 100 mm or less, preferably 1000 μm or less. An inside dimension (inner diameter) L1 of the coil portion 6 is, for example, 20 μm or more, preferably 50 μm or more, and for example, 500 mm or less, preferably 5 mm or less. An outside dimension (outer diameter) L2 of the coil portion 6 is, for example, 60 μm or more, preferably 150 μm or more, and for example, 500 mm or less, preferably 5 mm or less. A distance L3 between the two rear end portions in the right-left direction of the coil portion 6 is, for example, 20 μm or more, preferably 50 μm or more, and for example, 300 mm or less, preferably 2 mm or less. The cross-sectional area S of the coil pattern 5 is, for example, 20 $\mu m^2$ or more, preferably 2500 $\mu m^2$ or more, and for example, 20 $mm^2$ or less, preferably 0.1 $mm^2$ or less.

A length (width) W2 in the right-left direction of the terminal portion 7 is, for example, 20 μm or more, preferably 50 μm or more, and for example, 20 mm or less, preferably 10 mm or less. A length L4 in the front-rear direction of the terminal portion 7 is, for example, 20 μm or more, preferably 50 μm or more, and for example, 20 mm or less, preferably 10 mm or less. A gap between the terminal portions 7 that are next to each other is the same as the distance L3 between the rear end portions of the coil portion 6 described above.

4. Third Step

As shown in FIG. 2H, in the third step, the coil pattern 5 is pushed into the first adhesive layer 11.

The third step includes a fifth step (ref: FIG. 2F) of transferring the coil pattern 5 from the upper surface of the first peeling layer 2 onto the lower surface (one example of the one-side surface in the thickness direction) of the first adhesive layer 11, a sixth step (ref: FIG. 2G) of disposing a second peeling layer 9 on the lower surface (one example of the one-side surface in the thickness direction) of the coil pattern 5, a seventh step (ref: FIG. 2H) of press-bonding the second peeling layer 9 with respect to the first adhesive layer 11 and pushing the coil pattern 5 into the first adhesive layer 11 (ref: FIG. 2H), and an eighth step (ref: the arrow of FIG. 2H) of peeling the second peeling layer 9. In the third step, the fifth step to the eighth step are sequentially performed in this order. Hereinafter, each of the fifth step to the eighth step is sequentially described.

4-1. Fifth Step

As shown in FIG. 2F, in the fifth step, the coil pattern 5 is transferred from the upper surface of the first peeling layer 2 onto the lower surface of the first adhesive layer 11.

In the fifth step, as shown in FIG. 2D, first, the first adhesive layer 11 is prepared.

The first adhesive layer 11 has a generally flat plate shape extending in the plane direction.

The first adhesive layer 11 contains a first magnetic particle and a first resin component. To be specific, the first adhesive layer 11 is prepared from a first adhesive resin composition containing the first magnetic particle and the first resin component.

Examples of the first magnetic particle include a soft magnetic particle and a ferromagnetic particle, and preferably, a soft magnetic particle is used. An example of the soft magnetic particle includes a particle consisting of at least one kind selected from iron and iron alloy. Examples of the soft magnetic particle include magnetic stainless steel (Fe—Cr—Al—Si alloy) particle, sendust (Fe—Si—Al alloy) particle, permalloy (Fe—Ni alloy) particle, silicon copper (Fe—Cu—Si alloy) particle, Fe—Si alloy, particle, Fe—Si—B (—Cu—Nb) alloy particle, Fe—Si—Cr alloy particle, Fe—Si—Cr—Ni alloy particle, Fe—Si—Cr alloy particle, Fe—Si—Al—Ni—Cr alloy particle, carbonyliron particle, and ferrite particle (to be specific, Ni—Zn ferrite particle or the like). Of these, in view of magnetic properties, preferably, a Fe—Si—Cr alloy particle and a Ni—Zn ferrite particle are used. Examples of the soft magnetic particle include the soft magnetic particle described in known documents such as Japanese Unexamined Patent Publications No 2016-108561, 2016-006853, 2016-6852, and 2016-006163.

As the properties such as shape, holding strength, average particle size, and average thickness of the first magnetic particle, the properties described in the above-described known documents are used.

The volume ratio of the first magnetic particle in the first adhesive layer 11 is, for example, 15 volume % or more, preferably 20 volume % or more, more preferably 30 volume % or more, further more preferably 40 volume % or more. When the volume ratio of the first magnetic particle is the above-described lower limit or more, the improvement of the inductance of the first module 1 can be achieved. The volume ratio of the first magnetic particle in the first adhesive layer 11 is, for example, 70 volume % or less, preferably 65 volume % or less, more preferably 60 volume % or less. When the volume ratio of the first magnetic particle is the above-described upper limit or less, the push-in of the coil pattern 5 with respect to the first adhesive layer 11 can be surely performed, and the film-forming properties of the first adhesive resin composition are excellent.

The mass ratio of the first magnetic particle in the first adhesive layer 11 is, for example, 44 mass % or more, preferably 53 mass % or more, more preferably 66 mass % or more, further more preferably 75 mass % or more. When the mass ratio of the first magnetic particle is the above-described lower limit or more, the improvement of the inductance of the first module 1 can be achieved.

The mass ratio of the first magnetic particle in the first adhesive layer 11 is, for example, 93 mass % or less, preferably 91 mass % or less. When the mass ratio of the first magnetic particle is the above-described upper limit or less, the improvement of the pressure-sensitive adhesive properties of the first adhesive layer 11 can be achieved, and the film-forming properties of the first adhesive resin composition are excellent.

As the first resin component, for example, the resin component described in the above-described known document is used. These resin components can be used alone or in combination of two or more. Preferably, an epoxy resin, a phenol resin, and an acrylic resin are used in combination. When the epoxy resin, the phenol resin, and the acrylic resin are used in combination as the first resin component, the coil pattern 5 can be surely pushed into the first adhesive layer 11, and excellent flexibility and excellent heat resistance can be imparted to the first adhesive layer 11.

Each of the kind, the properties, and the ratio of the epoxy resin, the phenol resin, and the acrylic resin is described in the above-described known documents.

To prepare the first adhesive layer 11, the first particle and the first resin component are blended, thereby preparing the first adhesive resin composition. An additive (thermosetting catalyst, dispersant, rheology controlling agent, or the like) described in the above-described known documents can be also blended in the first adhesive resin composition. Also, the first adhesive resin composition can be prepared as a first adhesive resin composition solution that further contains a solvent. Then, the first adhesive resin composition solution is applied to the surface (the lower surface in FIG. 2D) of a peeling layer 10. Thereafter, the first adhesive resin composition solution is dried by heating, thereby removing the solvent. In this manner, the first adhesive layer 11 is disposed on the lower surface of the peeling layer 10. Preferably, the first adhesive layer 11 in a B-stage state is disposed on the lower surface of the peeling layer 10. To be specific, the first adhesive resin composition in an A-stage state is brought into a B-stage state by drying the first adhesive resin composition solution.

The peeling layer 10 is, for example, a separator having a generally flat plate shape extending in the plane direction from the polymeric material illustrated in the supporting board 21. The surface (the lower surface) of the peeling layer 10 is, for example, subjected to appropriate peeling treatment. The thickness of the peeling layer 10 is, for example, 15 μm or more, preferably 30 μm or more, and for example, 100 m or less, preferably 75 μm or less.

A pressure-sensitive adhesive force PS2 of the first adhesive layer 11 with respect to the coil pattern 5 is high relative to a pressure-sensitive adhesive force PS1 of the first peeling layer 2 (the pressure-sensitive adhesive layer 22) with respect to the coil pattern 5 (the conductive layer 3). That is, the relationship of PS1<PS2 is satisfied.

The first peeling layer 2 is not in contact with the first adhesive layer 11 (described later), and a pressure-sensitive adhesive force PS3 of the first peeling layer 2 with respect to the first adhesive layer 11 (ref: code 2 in parentheses of FIG. 2H of a modified example of the first embodiment to be described later) is relatively high. Also, PS3 is higher than PS2. That is, the relationship of PS2<PS3 is satisfied.

Then, the relationship of PS1<PS2<PS3 is satisfied.

In this manner, as shown in FIG. 2D, the first adhesive layer 11 that is disposed on the lower surface of the peeling layer 10 is formed.

Next, the peeling layer 10 and the first adhesive layer 11 are disposed at the upper side of the coil pattern 5 so that the first adhesive layer 11 faces the coil pattern 5, and subsequently, as shown in FIG. 2E, the lower surface of the first adhesive layer 11 is brought into contact with the upper surface of the coil pattern 5. At this time, the first adhesive layer 11 is disposed with respect to the coil pattern 5 so that the lower surface of the first adhesive layer 11 is spaced apart from the upper surface (the pressure-sensitive adhesion surface, the surface of the pressure-sensitive adhesion layer 22) of the first peeling layer 2 by the thickness of the coil pattern 5. That is, the first peeling layer 2 is not in contact with the first adhesive layer 11.

Thereafter, as shown by the arrows of FIG. 2E, and FIG. 2F, the first peeling layer 2 is peeled from the coil pattern 5.

In this manner, as shown in FIG. 2F, the fifth step of transferring the coil pattern 5 from the first peeling layer 2 onto the first adhesive layer 11 is performed.

4-2. Sixth Step and Seventh Step

As shown in FIG. 2G, in the sixth step, the second peeling layer 9 is disposed on the lower surface of the coil pattern 5. In the seventh step subsequent to the sixth step, the first peeling layer 2 is pushed into the first adhesive layer 11.

The second peeling layer 9 is a separator having a generally flat plate shape extending in the plane direction. The second peeling layer 9 is, for example, formed of the polymeric material illustrated in the supporting board 21. Also, the surface (the upper surface) of the second peeling layer 9 is, for example, subjected to appropriate peeling treatment.

In the sixth step shown in FIG. 2G, the second peeling layer 9 is not in contact with the first adhesive layer 11, and a pressure-sensitive adhesive force PS4 (ref: FIG. 2H) of the second peeling layer 9 with respect to the first adhesive layer 11 is relatively low (to be more specific, extremely low). Also, the pressure-sensitive adhesive force PS4 of the second peeling layer 9 is low with respect to the first adhesive layer 11 is low relative to the pressure-sensitive adhesive force PS3 of the first peeling layer 2 with respect to the first adhesive layer 11. Furthermore, PS4 is also low relative to the pressure-sensitive adhesive force PS1 of the first peeling layer 2 with respect to the coil pattern 5. That is, the relationship of PS4<PS1 is satisfied.

Then, each of the pressure-sensitive adhesive forces satisfies the following formula.

PS4<PS1<PS2<PS3

The thickness of the second peeling layer 9 is, for example, 15 μm or more, preferably 30 μm or more, and for example, 100 μm or less, preferably 75 μm or less.

The sixth step and the seventh step are continuously performed by using, for example, a pressing machine such as vacuum pressing machine.

To be specific, the peeling layer 10, the first adhesive layer 11, the coil pattern 5, and the second peeling layer 9 are set in the pressing machine (not shown) including an upper board and a lower board. To be more specific, for example, the peeling layer 10, the first adhesive layer 11, and the coil pattern 5 are set on the upper board, and the second peeling layer 9 is set on the lower board. Next, by driving the pressing machine, as shown by the arrows of FIG. 2F, and FIG. 2H, the second peeling layer 9 is press-bonded with respect to the first adhesive layer 11, and the coil pattern 5 is pushed into the first adhesive layer 11. In this manner, the seventh step is performed.

In the press-bonding of the second peeling layer 9 with respect to the first adhesive layer 11, as shown in FIG. 2G, the upper surface of the second peeling layer 9 is once in brought into contact with the lower surface of the coil pattern 5 (performance of the sixth step), and as shown in FIG. 2H, continuously, the coil pattern 5 is pushed into the first adhesive layer 11 (performance of the seventh step).

In the seventh step, the coil pattern 5 is sunk into the first adhesive layer 11, and a portion of the first adhesive layer 11 that faces the coil pattern 5 in the thickness direction goes around the side of the coil pattern 5. Then, the side surfaces of the coil pattern 5 are covered with the first adhesive layer 11.

At the same time with this, the upper surface of the second peeling layer 9 is in contact with the lower surface of the first adhesive layer 11 in a portion other than the coil pattern 5.

At this time, the pressure-sensitive adhesive force PS4 of the second peeling layer 9 with respect to the first adhesive layer 11 is extremely low, so that in the above-described contact of the second peeling layer 9 with the first adhesive layer 11, the second peeling layer 9 does not substantially pressure-sensitively adhere to the first adhesive layer 11.

By the seventh step, the lower surface of the coil pattern 5 and the lower surface of the first adhesive layer 11 are flush with each other to be continuous in the plane direction.

4-3 Eighth Step

As shown by the arrow at the lower side of FIG. 2H, in the eighth step, the second peeling layer 9 is peeled (separated) from the coil pattern 5 and the first adhesive layer 11.

Figure 4A:
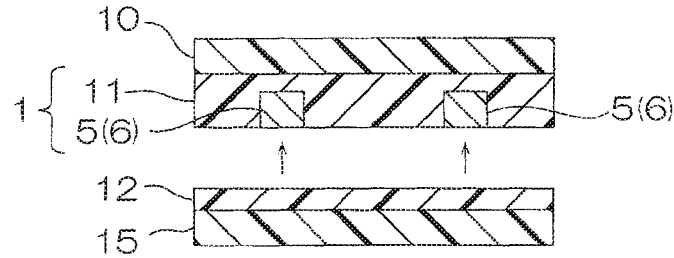
Figure 4A:
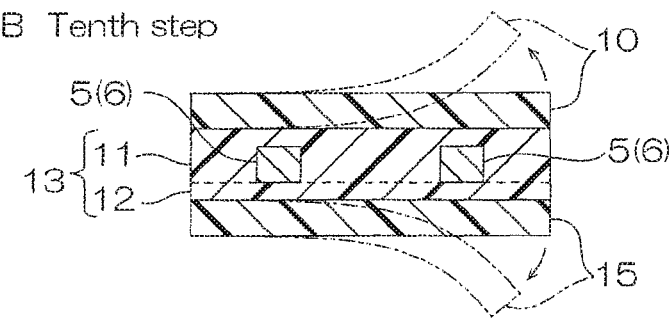

In this manner, as shown in FIG. 4A, the lower surface of the coil pattern 5 is exposed downwardly from the first adhesive layer 11.

Along with this, as shown by the arrow at the upper side of FIG. 2H, the peeling layer 10 is peeled from the first adhesive layer 11. The upper surface of the first adhesive layer 11 is exposed upwardly.

In this manner, the third step of pushing the coil pattern 5 into the first adhesive layer 11 is performed.

In this manner, as shown by a solid line of FIG. 2I, the first module 1 including the first adhesive layer 11 and the coil pattern 5 is produced. The first module 1 preferably consists of the first adhesive layer 11 and the coil pattern 5 only.

The first module 1 of the first embodiment is an intermediate member of a second module 31 (described later) in the second embodiment, does not include a second adhesive layer 12 (described later, ref: FIG. 4B), and is a member in which the first module 1 alone can be industrially available.

Thereafter, if necessary, when the first adhesive layer 11 is in a B-stage state, the first module 1 is heated, so that the first adhesive layer 11 is brought into a C-stage state.

The thickness of the first module 1 is, for example, 750 μm or less, preferably 500 μm or less, more preferably 300 μm or less, and for example, 50 μm or more. The thickness of the first module 1 is a distance between the lower surface of the coil pattern 5 and the upper surface of the first adhesive layer 11. When the thickness of the first module 1 is the above-described upper limit or less, the thinning of the first module 1 can be achieved.

The inductance of the first module 1 is, for example, 0.1 nH or more, preferably 0.5 nH or more, more preferably 1 nH or more. The inductance is measured with an impedance analyzer (manufactured by Keysight Technologies, E4991B. 1 GHz). The subsequent inductance is measured by the same method as that described above.

5. Uses of First Module

The first module 1 obtained by the method for producing the first module 1 includes an inductor. The first module 1 is, for example, used in wireless power transmission (wireless power feeding), wireless communication, a sensor, or the like. The lower surface of the coil pattern 5 is exposed, so that the first module 1 is preferably used in wireless power transmission and wireless communication.

Function and Effect of First Embodiment

According to the method for producing the first module 1, the first module 1 without including a ferrite board described in Patent Document 1 can be produced. Thus, the thinning of the first module 1 can be achieved.

In the third step of the method for producing the first module 1, as shown in FIG. 2H, the coil pattern 5 is pushed into the first adhesive layer 11 containing the first magnetic particle, so that the further thinning of the first module 1 can be achieved, and high inductance can be ensured.

Furthermore, in the second step of the method for producing the first module 1, as shown in FIG. 2D, the coil pattern 5 can be formed from the conductive layer 3 for a short period of time with respect to the method described in Patent Document 1 using the plating.

According to the method for producing the first module 1, the first peeling layer 2 is peeled from the coil pattern 5, so that the coil pattern 5 can be surely exposed.

According to the method for producing the first module 1, as shown in FIG. 2F, in the fifth step, the coil pattern 5 is transferred from the upper surface of the first peeling layer 2 onto the lower surface of the first adhesive layer 11, and as shown in FIG. 2G, in the sixth step, the second peeling layer 9 having the pressure-sensitive adhesive force PS4 with respect to the first adhesive layer 11 that is lower than the pressure-sensitive adhesive force PS3 of the first peeling layer 2 with respect to the first adhesive layer 11 is disposed on the lower surface of the coil pattern 5. Then, as shown in FIG. 2H, in the seventh step, even when the second peeling layer 9 is press-bonded to the first adhesive layer 11, the pressure-sensitive adhesion of the second peeling layer 9 with respect to the first adhesive layer 11 can be suppressed, and the coil pattern 5 can be pushed into the First adhesive layer 11.

Thereafter, as shown by a phantom line of FIG. 2H, in the eighth step, the second peeling layer 9 can be easily and surely peeled from the first adhesive layer 11.

According to the method for producing the first module 1, in the second step, as shown in FIGS. 2B and 2C, when the conductive layer 3 is etched to form the coil pattern 5, the coil pattern 5 can be formed for a shorter period of time compared to the plating described in Patent Document 1.

According to the method for producing the first module 1, when the content ratio of the first magnetic particle in the first adhesive layer 11 is 15 volume % or more, the improvement of the inductance can be achieved. When the content ratio of the first magnetic particle in the first adhesive layer 11 is 60 volume % or less, the push-in of the coil pattern 5 with respect to the first adhesive layer 11 can be surely performed. Thus, both of the improvement of the inductance and the improvement of the push-in properties of the coil pattern 5 with respect to the first adhesive layer 11 can be achieved.

According to the method for producing the first module 1, when the first resin component is the epoxy resin, the phenol resin, and the acrylic resin, in the third step, as shown in FIG. 2H, the coil pattern 5 can be surely pushed into the first adhesive layer 11, and the first module 1 having excellent flexibility and excellent heat resistance can be produced.

Modified Example of First Embodiment

In a modified example, the same reference numerals are provided for members and steps corresponding to each of those in the first embodiment, and their detailed description is omitted.

In the first embodiment, as shown in FIGS. 2B and 2C, in the second step, the conductive layer 3 is etched. However, the trimming of the conductive layer 3 is not limited to this, and for example, as shown by the phantom line of FIG. 2A, a cutting line 28 (wide phantom line) is formed by a cutting blade 27 (phantom line) or the like, so that a portion other than the coil pattern 5 can be also removed.

Preferably, the conductive layer 3 is etched. When the conductive layer 3 is etched, the coil pattern 5 can be formed for a shorter period of time compared to the plating of the additive method of Patent Document 1. Furthermore, in the etching of the conductive layer 3, the coil pattern 5 can be accurately formed.

In the first embodiment, in the third step, as shown in FIG. 2F, in the fifth step, the coil pattern 5 is transferred from the first peeling layer 2 to the first adhesive layer 11; as shown in FIG. 2F, in the sixth step, the second peeling layer 9 is disposed on the lower surface of the coil pattern 5: and subsequently, as shown in FIG. 2H, in the seventh step, the second peeling layer 9 is press-bonded to the first adhesive layer 11. That is, after the first peeling layer 2 is once peeled from the lower surface of the coil pattern 5, the second peeling layer 9 is disposed on the lower surface of the coil pattern 5, and the second peeling layer 9 is press-bonded to the first adhesive layer 11.

Meanwhile, as shown by the code 2 in parentheses of FIG. 2H the first peeling layer 2 is used as it is without peeling and without disposing the second peeling layer 9, so that the first peeling layer 2 can be also press-bonded to the first adhesive layer 11.

However, in this method, as shown in FIG. 2H, in the seventh step, when the first peeling layer 2 is pushed into the first adhesive layer 11, the pressure-sensitive adhesive force PS3 of the first peeling layer 2 with respect to the first adhesive layer 11 is relatively high, so that there may be a case where the first peeling layer 2 unintentionally pressure-sensitively adheres to the first adhesive layer 11, and thereafter, as shown by the phantom line of FIG. 2H, in the eight step, the first peeling layer 2 cannot be excellently peeled from the first adhesive layer 11.

Thus, preferably, as shown in FIG. 2F, after the first peeling layer 2 is once peeled, as shown in FIG. 2G, the second peeling layer 9 is disposed, and as shown in FIG. 2H, the second peeling layer 9 is press-bonded to the first adhesive layer 11.

According to this method, as shown in FIG. 2F, in the fifth step, the coil pattern 5 is transferred from the upper surface of the first peeling layer 2 onto the lower surface of the first adhesive layer 11, and as shown in FIG. 24 in the sixth step, the second peeling layer 9 having the pressure-sensitive adhesive force PS4 with respect to the first adhesive layer 11 that is lower than the pressure-sensitive adhesive force PS3 of the first peeling layer 2 with respect to the first adhesive layer 11 is disposed on the lower surface of the coil pattern 5. Then, as shown in FIG. 2H, in the seventh step, even when the second peeling layer 9 pressure-sensitively adheres to the first adhesive layer 11, the pressure-sensitive adhesion of the second peeling layer 9 with respect to the first adhesive layer 11 is suppressed, and the coil pattern 5 can be pushed into the first adhesive layer 11.

Thereafter, as shown by the arrow at the lower side of FIG. 2H, in the eighth step, the second peeling layer 9 can be easily and surely peeled from the first adhesive layer 11.

In the first embodiment, as shown in FIG. 1, the number of the coil pattern 5 is defined as 1. However, the number thereof is not particularly limited, and may be, for example, in plural.

As shown by the phantom line of FIG. 2I, the method for producing the first module 1 can further include a ninth step of disposing a magnetic layer 18 on the upper surface (one example of the other-side surface in the thickness direction) of the first adhesive layer 11.

In the ninth step, first, the magnetic layer 18 is prepared.

The magnetic layer 18 is a core material for focusing a magnetic field generated in the coil pattern 5, and amplifying a magnetic flux. The magnetic layer 18 is also a shield material for preventing a magnetic flux leakage to the outside of the coil pattern 5 (or shielding a noise from the outside of the coil pattern 5 with respect to the coil pattern 5). The magnetic layer 18 has a generally flat plate (sheet) shape extending in the plane direction.

The magnetic layer 18 contains a second magnetic particle and a second resin component. To be specific, the magnetic layer 18 is formed from a magnetic resin composition containing the second magnetic particle and the second resin component.

As the second magnetic particle, the same magnetic particle as that of the first magnetic particle is used, and preferably, in view of magnetic properties, a sendust (Fe—Si—Al alloy) particle is used. As the properties such as shape, holding strength, average particle size, and average thickness of the second magnetic particle, the properties described in the above-described known documents are used.

The volume ratio of the second magnetic particle in the magnetic layer 18 is, for example, 40 volume % or more, preferably 45 volume % or more, more preferably 48 volume % or more, further more preferably 60 volume % or more, and for example, 90 volume % or less, preferably 85 volume % or less, more preferably 80 volume % or less. When the volume ratio of the second magnetic particle is the above-described lower limit or more, the improvement of the inductance of the first module 1 can be further more achieved. When the volume ratio of the second magnetic particle is the above-described upper limit or less, the film-forming properties of the magnetic resin composition are excellent.

The mass ratio of the second magnetic particle in the magnetic layer 18 is, for example, 80 mass % or more, preferably 83 mass % or more, more preferably 85 mass % or more, and for example, 98 mass % or less, preferably 95 mass % or less, more preferably 90 mass % or less. When the mass ratio of the second magnetic particle is the above-described lower limit or more, the magnetic properties of the first module 1 are excellent. When the mass ratio of the second magnetic particle is the above-described upper limit or less, the magnetic resin composition is excellent.

As the second resin component, the same resin component as that of the first resin component is used. Preferably, the epoxy resin, the phenol resin, and the acrylic resin are used in combination. When the epoxy resin, the phenol resin, and the acrylic resin are used in combination as the second resin component, excellent flexibility and excellent heat resistance can be imparted to the magnetic layer 18.

To prepare the magnetic layer 18, the second magnetic particle and the second resin component are blended, thereby preparing the magnetic resin composition. An additive (thermosetting catalyst, dispersant, rheology controlling agent, or the like) described in the above-described known documents can be also blended in the magnetic resin composition. Also, the magnetic resin composition can be prepared as a magnetic resin composition solution that further contains a solvent. Then, the magnetic resin composition solution is applied to the surface of a peeling substrate that is not shown. Thereafter, the magnetic resin composition solution is dried by heating, thereby removing the solvent. In this manner, the magnetic layer 18 is prepared. Preferably, the magnetic layer 18 in a B-stage state is prepared.

Subsequently, when the magnetic layer 18 is in a B-stage state, the plurality of magnetic layers 18 are laminated in the thickness direction to be hot pressed in the thickness direction, so that the magnetic layer 18 in a C-stage state is formed. The lamination number of the magnetic layer 18 is not particularly limited, and for example, 2 or more, preferably 5 or more, and for example, 20 or less, preferably 10 or less. As the conditions of the hot pressing, the conditions described in the above-described known documents are appropriately used.

The average thickness of the magnetic layer 18 is, for example, 5 μm or more, preferably 10 μm or more, and for example, 500 μm or less, preferably 250 μm or less.

As shown by the phantom line at the upper side of FIG. 2I, the magnetic layer 18 is brought into contact with the upper surface of the first adhesive layer 11. Preferably, the magnetic layer 18 is press-bonded to the first adhesive layer 11. For example, by using a pressing machine such as vacuum pressing machine, the magnetic layer 18 is attached to the first adhesive layer 11.

When the first adhesive layer 11 is in a B-stage state, the magnetic layer 18 pressure-sensitively adheres to the upper surface of the first adhesive layer 11. Thereafter, if necessary, the first adhesive layer 11 is brought into a C-stage state, and the magnetic layer 18 adheres to the first adhesive layer 11.

The first module 1 of the modified example includes the first adhesive layer 11, the coil pattern 5, and the magnetic layer 18. Preferably, the first module 1 consists of the first adhesive layer 11, the coil pattern 5, and the magnetic layer 18 only.

In the modified example, the same function and effect as that of the first embodiment can be achieved.

According to the method for producing the first module 1, as shown by the phantom line of FIG. 2H, in the ninth step, the magnetic layer 18 is disposed on the upper surface of the first adhesive layer 11, so that the inductance of the first module 1 can be further more improved.

In the sixth step and the seventh step of the first embodiment, the peeling layer 10, the first adhesive layer 11, and the coil pattern 5 are set on the upper board, and the second peeling layer 9 is set on the lower board. However, the arrangement is not limited to this. For example, all of the peeling layer 10, the first adhesive layer 11, the coil pattern 5, and the second peeling layer 9 can beset on the upper board only. Alternatively, all of the peeling layer 10, the first adhesive layer 11, the coil pattern 5, and the second peeling layer 9 can be also set on the lower board only.

Second Embodiment

In the second embodiment, the same reference numerals are provided for members and steps corresponding to each of those in the first embodiment, and their detailed description is omitted.

As shown by the solid line of FIG. 2IL in the first embodiment, the first module 1 in which the lower surface of the coil pattern 5 is exposed is produced.

However, as shown in FIG. 4B, the method for producing the second module 31 of the second embodiment further includes a tenth step of embedding the coil pattern 5 by an adhesive layer 13 including the first adhesive layer 11 and the second adhesive layer 12 by covering the lower surface of the coil pattern 5 with the second adhesive layer 12.

Furthermore, as shown in FIG. 4I), the method for producing the second module 31 of the second embodiment further includes a twelfth step of disposing each of the two magnetic layers 18 on the upper surface and the lower surface of the adhesive layer 13.

Hereinafter, the tenth step and the twelfth step are sequentially described with reference to FIG. 3, and FIGS. 4A to 4D.

6. Uses of Second Module of Second Embodiment

The coil pattern 5 is embedded in the adhesive layer 13, so that the second module 31 of the second embodiment is preferably used in a sensor.

Function and Effect of Second Embodiment

According to the second embodiment, the same function and effect as that of the first embodiment can be achieved.

According to the method for producing the second module 31, as shown in FIG. 4B, in the tenth step, the adhesive layer 13 that embeds the coil pattern 5 is formed, so that the inductance of the second module 31 can be further more improved.

According to the method for producing the second module 31, as shown in FIG. 4D, in the twelfth step, the magnetic layer 18 is disposed on the upper surface and the lower surface of the adhesive layer 13, so that the inductance of the second module 31 can be further more improved.

According to the method for producing the second module 31, when the content ratio of the second magnetic particle in the magnetic layer 18 is high of 40 volume % or more, the improvement of the inductance can be further more achieved by the magnetic layer 18.

Figure 4C:
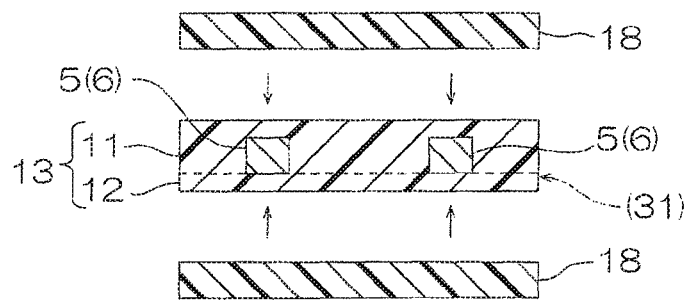
Figure 4C:
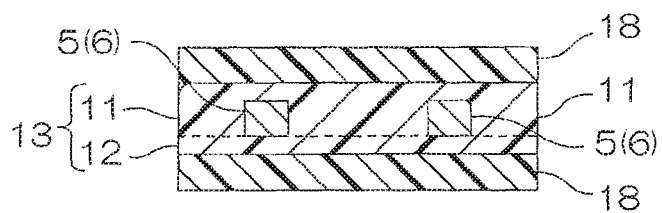

As shown in the central view of FIG. 4C, the second module 31 can also consist of the coil pattern and the adhesive layer 13 that embeds the coil pattern 5 without including the magnetic layer 18. At this time, the method for producing the second module 31 does not include the twelfth step shown in FIG. 4D.

Modified Example of Second Embodiment

Figure 3:
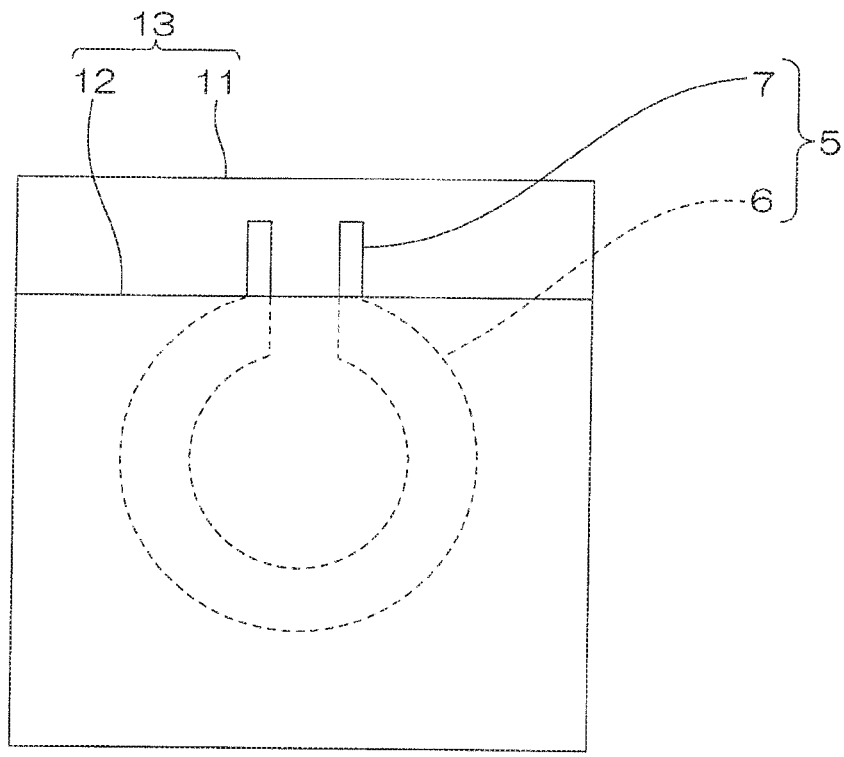
FIG. 3 shows a bottom view of a second module obtained by a second embodiment of the method for producing a module of the present invention.
Figure 3:
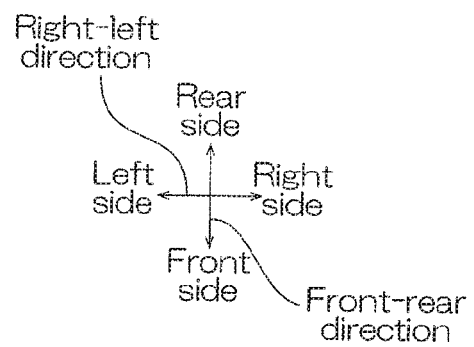

In the second embodiment, as shown in FIG. 3, the number of the coil pattern 5 is defined as 1. However, the number thereof is not particularly limited, and may be, for example, in plural. When the number of the coil pattern 5 is in plural, the second module 31 can be preferably used as a sensor.

Third Embodiment

In the third embodiment, the same reference numerals are provided for members and steps corresponding to each of those in the first and second embodiments, and their detailed description is omitted. The third embodiment can achieve the same function and effect as that described above.

Figure 5A:
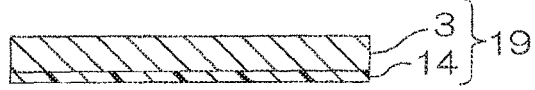
Figure 5A:
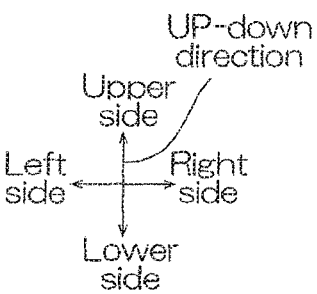
Figure 5A:
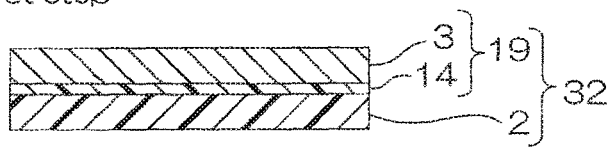
Figure 5C:
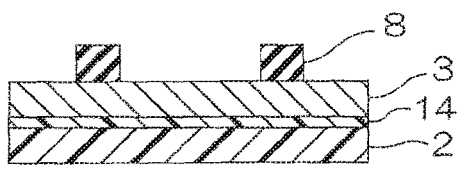
Figure 5C:
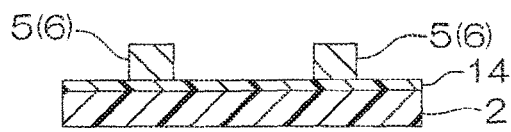
Figure 5C:
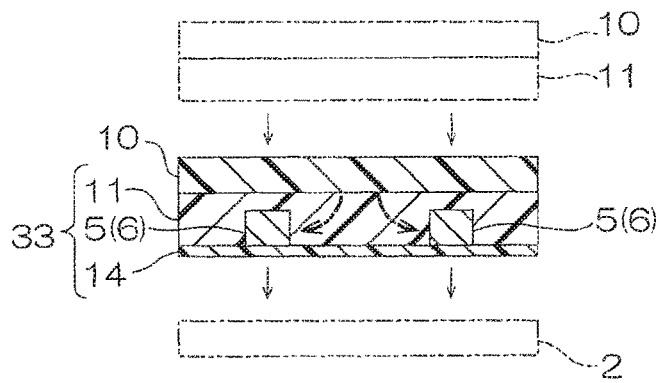
Figure 5F:
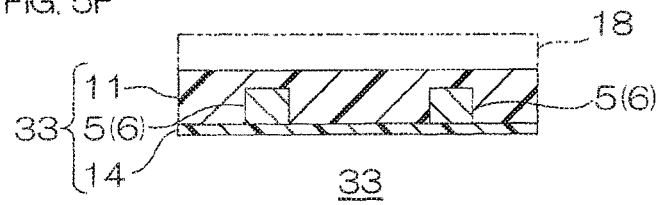

As shown in FIG. 5F, in the third embodiment, the third module 33 includes a supporting layer 14 in addition to the coil pattern 5 and the first adhesive layer 11.

The supporting layer 14 is a substrate sheet (thin film) that supports the coil pattern 5 from the lower side thereof. The supporting layer 14 has a generally rectangular sheet shape when viewed from the top. The supporting layer 14 forms the lower surface of a third module 33. The supporting layer 14 is in contact with the lower surface of the coil pattern 5 and the lower surface of the first adhesive layer 11.

A material of the supporting layer 14 is a material having toughness, and examples thereof include resins such as polyimide, polyester, polyolefin, and fluorine resin. Preferably, polyimide is used. The thickness of the supporting layer 14 is, for example, 20 μm or less, preferably 10 μm or less, and for example, 0.1 μm or more, preferably 0.5 μm or more.

To obtain the third module 33, first, in the first step, as shown in FIG. 5A, the conductive layer 3 that is disposed on the above-described supporting layer 14 is prepared. To be specific, the conductive layer 3 that is disposed on the upper surface (one example of the one-side surface in the thickness direction) of the supporting layer 14 is prepared. For example, a two-layer substrate 19 that sequentially includes the supporting layer 14 and the conductive layer 3 is prepared.

As shown in FIG. 5B, next, the first peeling layer 2 is attached to the lower surface of the supporting layer 14. That is, the conductive layer 3 is laminated in the first peeling layer 2 via the supporting layer 14. In this manner, in the first step, a three-layer substrate 32 that sequentially includes the first peeling layer 2, the supporting layer 14, and the conductive layer 3 is prepared.

As shown in FIG. 5C, in the second step, next, an etching resist 8 is disposed on the upper surface of the conductive layer 3. As shown in FIG. 5D, next, the conductive layer 3 that is exposed from the etching resist 8 is removed by etching. In this manner, the coil pattern 5 is formed.

As shown in FIG. 5E, in the third step, next, the coil pattern 5 is pushed into the first adhesive layer 11. Along with this, in the fourth step, as shown by the phantom line, the second peeling layer 9 is peeled from the coil pattern 5 and the first adhesive layer 11.

In this manner, the third module 33 that includes the supporting layer 14, the coil pattern 5, and the first adhesive layer 11 is produced.

Thereafter, when the first adhesive layer 11 is in a B-stage state, the third module 33 is heated, or pressurized and heated, so that the first adhesive layer 11 is brought into a C-stage state.

The third module 33 of the third embodiment is an intermediate member of a fourth module 34 (described later) in the fourth embodiment, does not include the second adhesive layer 12 (described later, ref. FIG. 6B), and is a member in which the third module 33 alone can be industrially available.

Function and Effect of Third Embodiment

According to the method for producing the third module 33, as shown in FIG. 5B, in the first step, the conductive layer 3 is laminated in the first peeling layer 2 via the supporting layer 14, so that as shown in FIG. 5E, in the third step, the coil pattern 5 can be pushed into the first adhesive layer 11, while supported by the supporting layer 14.

Meanwhile, in the third step, when the coil pattern 5 is pushed into the first adhesive layer 11, a stress from the outside is imparted from the first adhesive layer 11 to the coil pattern 5 by the stress (heat shrinkage force) or pressurization, and thus, the position displacement in the plane direction of the coil pattern 5 easily occurs. In this case, the third module 33 having the inductance that is displaced from the inductance originally designed caused by the position displacement of the coil pattern 5 is obtained.

However, according to the method for producing the third module 33, the coil pattern 5 is supported by the supporting layer 14, so that the position displacement of the coil pattern 5 in the process of the above-described C-stage state can be suppressed, and the position accuracy of the coil pattern 5 can be improved. Thus, the above-described displacement of the inductance is prevented, and the third module 33 having the inductance originally designed can be produced.

Fourth Embodiment

In the fourth embodiment, the same reference numerals are provided for members and steps corresponding to each of those in the first to third embodiments, and their detailed description is omitted. The fourth embodiment can achieve the same function and effect as that described above.

As shown in FIG. 5F, in the third embodiment, the third module 33 in which the lower surface of the supporting layer 14 is exposed is produced.

However, as shown in FIG. 6D, the method for producing the fourth module 34 of the fourth embodiment further includes an eleventh step of sandwiching the coil pattern 5 and the supporting layer 14 in the thickness direction by the adhesive layer 13 that includes the first adhesive layer 11 and the second adhesive layer 12 by covering the lower surface of the supporting layer 14 with the second adhesive layer 12.

Furthermore, as shown in FIG. 6D, the method for producing the fourth module 34 of the fourth embodiment further includes a twelfth step of disposing each of the two magnetic layers 18 on the upper surface and the lower surface of the adhesive layer 13.

Figure 6A:
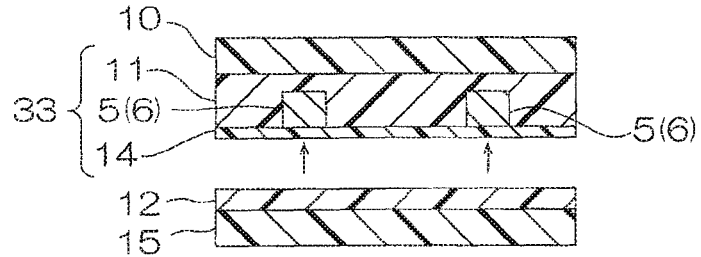
Figure 6A:
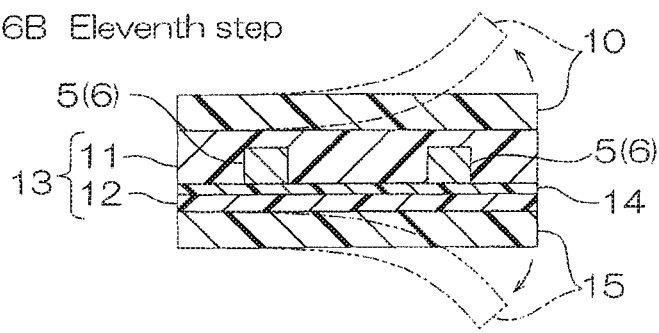

As shown by the arrows of FIG. 6A, and FIG. 6B, in the eleventh step, the lower surface of the supporting layer 14 is covered with the second adhesive layer 12. The adhesive layer 13 that includes the first adhesive layer 11 and the second adhesive layer 12 is obtained. In this manner, the coil pattern 5 and the supporting layer 14 are sandwiched in the up-down direction by the adhesive layer 13.

Thereafter, as shown by the arrows of FIG. 6B, a third peeling layer 15 is peeled from the second adhesive layer 12 (the lower surface of the adhesive layer 13). Along with this, the peeling layer 10 is peeled from the first adhesive layer 11 (the upper surface of the adhesive layer 13).

Figure 6C:
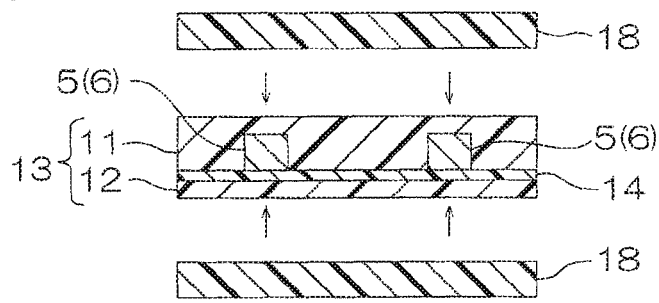
Figure 6C:
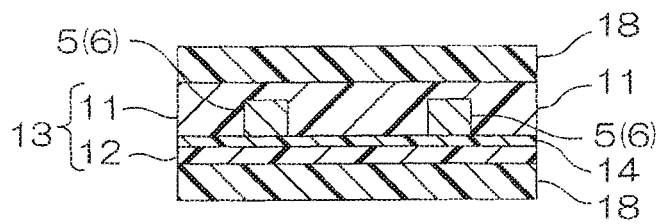

As shown by the arrows of FIG. 6C, and FIG. 6D, in the twelfth step, each of the two magnetic layers 18 is disposed on the upper surface and the lower surface of the adhesive layer 13.

In the twelfth step, as shown in FIG. 6C, the two magnetic layers 18 are prepared. Subsequently, when the adhesive layer 13 is in a B-stage state, as shown by the arrows of FIG. 6C, each of the two magnetic layers 18 pressure-sensitively adheres to the upper surface and the lower surface of the adhesive layer 13.

Thereafter, if necessary, when the adhesive layer 13 is in a B-stage state, the fourth module 34 is heated, or pressurized and heated, so that the adhesive layer 13 is brought into a C-stage state.

In this manner, as shown in FIG. 6D, the fourth module 34 including the adhesive layer 13, the coil pattern 5 and the supporting layer 14 sandwiched in the thickness direction of the adhesive layer 13, and the magnetic layer 18 that is disposed on the upper surface and the lower surface of the adhesive layer 13 is produced.

According to the method for producing the fourth module 34, as shown in FIG. 6B, in the eleventh step, the adhesive layer 13 that sandwiches the coil pattern 5 and the supporting layer 14 therebetween is formed, so that the inductance of the fourth module 34 can be further more improved, while the position accuracy of the coil pattern 5 is improved.

EXAMPLES

Next, the present invention is described based on Examples and Comparative Examples. The present invention is however not limited by these Examples and Comparative Examples. The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Example 1

Example Corresponding to Second Embodiment (First Step)

As shown in FIG. 2A, the conductive layer 3 having a thickness of 50 μm and made of copper pressure-sensitively adhered to the upper surface of the first peeling layer 2 (slightly pressure-sensitive adhesive film, model number: "PC-751", manufactured by FUJIMORI KOGYO CO., LTD) having a thickness of 55 μm.

The first peeling layer 2 sequentially included the supporting board 21 having a thickness of 50 μm and made of PET, and the pressure-sensitive adhesive layer 22 having a thickness of 5 μm and made of an acrylic pressure-sensitive adhesive.

In this manner, the first step of preparing the conductive layer 3 that was defined as the upper surface of the first peeling layer 2 was performed.

(Second Step)

Next, as shown in FIG. 2D, the conductive layer 3 was trimmed, thereby forming the coil pattern 5.

To be specific, the coil pattern 5 was formed by a subtractive method. That is, first, as shown in FIG. 2B, a photoresist was disposed on the entire upper surface of the conductive layer 3. Next, the photoresist was subjected to photo processing, so that as shown in FIG. 1A, the etching resist 8 having the same pattern as that of the coil pattern 5 was disposed on the upper surface of the conductive layer 3. Subsequently, as shown in FIG. 2C, the conductive layer 3 that was exposed from the etching resist 8 was removed by etching. As the etching solution, a ferric chloride solution was used, and the first peeling layer 2, the conductive layer 3, and the etching resist 8 were immersed for 90 seconds. Thereafter, as shown in FIG. 2D, the etching resist 8 was peeled by a peeling liquid.

In this manner, the second step of forming the coil pattern 5 from the conductive layer 3 was performed.

As shown in FIG. 1, the coil pattern 5 continuously had the coil portion 6 having an inside dimension L1 of 1900 μm, an outside dimension L2 of 3100 μm, a width W1 of 600 μm, and a distance L3 between the two rear end portions thereof of 600 μm, and the two terminal portions 7 having a width W2 of 200 μm.

(Third Step)

(Fifth Step to Seventh Step)

As shown in FIG. 2H, next, the coil pattern 5 was pushed into the first adhesive layer 11.

To be specific, first as shown in FIG. 2D, the first adhesive layer 11 was prepared.

To prepare the first adhesive layer 11, first, each of the components was blended in accordance with Table 1 to prepare an adhesive resin composition (first adhesive resin composition), and subsequently, the adhesive resin composition was dissolved in methyl ethyl ketone, so that an adhesive resin composition solution having the solid content concentration of 35 mass % was prepared. Next, the adhesive resin composition solution was applied to the surface of the peeling layer 10 (model number: "MRA50", manufactured by Mitsubishi Plastics, Inc.) having a thickness of 50 μm and made of PET to be thereafter dried at 110° C. for 2 minutes. In this manner, as shown in FIG. 2D, the first adhesive layer 11 in a B-stage state having an average thickness of 45 μm was formed.

As shown in FIG. 2F, thereafter, the coil pattern 5 was transferred from the first peeling layer 2 onto the first adhesive layer 11 (the fifth step).

To be specific, first, the peeling layer 10 and the first adhesive layer 11 were disposed at the upper side of the coil pattern 5 so that the first adhesive layer 11 faced downwardly. Subsequently, as shown in FIG. 2E, the lower surface of the first adhesive layer 11 was brought into contact with the upper surface of the coil pattern 5. At this time, the first adhesive layer 11 was disposed with respect to the coil pattern 5 so that the lower surface of the first adhesive layer 11 was spaced apart from the upper surface (the pressure-sensitive adhesion surface, the surface of the pressure-sensitive adhesion layer 22) of the first peeling layer 2 by the thickness of the coil pattern 5.

Thereafter, as shown by the arrows of FIG. 2E, and FIG. 2F, the first peeling layer 2 was peeled from the coil pattern 5.

In this manner, as shown in FIG. 2F, the fifth step of transferring the coil pattern 5 from the first peeling layer 2 onto the first adhesive layer 11 was performed.

As shown in FIG. 2G next, the second peeling layer 9 was disposed on the lower surface of the coil pattern 5 (the sixth step).

To be specific, first, as shown in FIG. 2F, the second peeling layer 9 (model number: "MRA50", manufactured by Mitsubishi Plastics, Inc.) having a thickness of 50 μm and made of PET was prepared. Subsequently, the coil pattern 5 and the second peeling layer 9 were set in a vacuum pressing machine having the upper board and the lower board (not shown). To be specific, the peeling layer 10, the first adhesive layer 11, and the coil pattern 5 were set on the upper board, and the second peeling layer 9 was set on the lower board. Next, the vacuum pressing machine was driven, and as shown by the arrows of FIG. 2F, and FIG. 2H, the second peeling layer 9 was press-bonded to the first adhesive layer 11, so that the coil pattern 5 was pushed into the first adhesive layer 11 (the seventh step). In the press-bonding of the second peeling layer 9 with respect to the first adhesive layer 11, the upper surface of the second peeling layer 9 was once brought into contact with the lower surface of the coil pattern 5 (performance of the sixth step). Continuously, as shown in FIG. 2H, the upper surface of the second peeling layer 9 was pushed into the first adhesive layer 11. In the seventh step, the second peeling layer 9 and the first adhesive layer 11 were in contact with each other in a portion other than the coil pattern 5.

Thereafter, as shown by the arrow at the lower side of FIG. 2H, the second peeling layer 9 was peeled from the coil pattern 5 and the first adhesive layer 11 (the eighth step). In this manner, as shown in FIG. 4A, the lower surface of the coil pattern 5 was exposed downwardly from the first adhesive layer 11.

In this manner, the third step was performed.

In this manner, as shown in FIG. 2H, the first module 1 was obtained as an intermediate member for obtaining the second module 31 to be described later. The first module 1 included the first adhesive layer 11, and the coil pattern 5 that was pushed into the first adhesive layer 11, and was supported (protected) by the peeling layer 10 and the second peeling layer 9.

(Tenth Step)

Next, as shown in FIG. 4B, the lower surface of the coil pattern 5 was covered with the second adhesive layer 12 so as to expose the lower surface of the terminal portion 7.

To be specific, as shown by the phantom line at the lower side of FIG. 214, the second peeling layer 9 was peeled from the first adhesive layer 11 and the coil pattern 5.

Subsequently, as shown in FIG. 4A, the second adhesive layer 12 in a B-stage state having an average thickness of 40

μm was formed on the upper surface of the third peeling layer 15 in accordance with the same method as that of the first adhesive layer 11. Next, as shown by the arrows of FIG. 4A, and FIG. 4B, the upper surface of the second adhesive layer 12 pressure-sensitively adhered to the lower surface of the coil portion 6 and the lower surface of the first adhesive layer 11. In this manner, the tenth step of forming the adhesive layer 13 including the first adhesive layer 11 and the second adhesive layer 12, and embedding the coil portion 6 was performed.

Thereafter, as shown by the arrow at the lower side of FIG. 4B, the peeling layer 10 was peeled from the first adhesive layer 11. Also, as shown by the arrow at the upper side of FIG. 4B, the third peeling layer 15 was peeled from the second adhesive layer 12.

(Twelfth Step)

As shown in FIG. 4D, the magnetic layer 18 was disposed on the upper surface and the lower surface of the adhesive layer 13.

To be specific, first, in accordance with Table 1, each of the components was blended to prepare a magnetic resin composition, and subsequently, the magnetic resin composition was dissolved in methyl ethyl ketone, so that a magnetic resin composition solution having the solid content concentration of 45 mass % was prepared. Next, the magnetic resin composition solution was applied to a peeling substrate that was not shown to be thereafter dried at 110° C. for 2 minutes. In this manner, the magnetic layer 18 (average thickness of 45 μm) in a B-stage state was prepared. Thereafter, the magnetic layer 18 was peeled from the peeling substrate, and the eight layers of magnetic layers 18 were laminated to be heated and cured by hot pressing under the conditions of 175° C. 30 minutes, and 10 MPa, in this manner, as shown in FIG. 4C, the magnetic layer 18 in a C-stage state (average thickness of 20.0 m) was fabricated.

By using the vacuum pressing machine, each of the two magnetic layers 18 pressure-sensitively adhered (was attached) to the upper surface of the adhesive layer 13 (the upper surface of the first adhesive layer 11) and the lower surface thereof (the lower surface of the second adhesive layer 12). In this manner, the twelfth step was performed.

In this manner, the second module 31 including the adhesive layer 13, the coil pattern 5 having the coil portion 6 that was embedded in the adhesive layer 13, and the magnetic layer 18 that was disposed on the upper surface and the lower surface of the adhesive layer 13 was produced.

Thereafter, the adhesive layer 13 in a B-stage state was brought into a C-stage state.

Examples 2 to 6 and Comparative Example 1

The first module 1 was produced, and subsequently, the second module 31 was produced in the same manner as that of Example 1, except that the adhesive resin composition was changed in accordance with Table 1.

TABLE 1

| | | | Ex. • Comp. Ex. | | Ex. 1 | Ex. 2 | Ex. 3 | Ex. 4 | Ex. 5 | Ex. 6 | Comp. Ex. 1 |
|---|---|---|---|---|---|---|---|---|---|---|---|
| Adhesive Layer | Adhesive Resin Composition (First Adhesive Resin Composition) | Soft Magnetic Particle | Ni—Zn Ferrite Particle | [parts by mass] | 44.68 | 75.36 | — | — | — | — | — |
| | | | Fe—Si—Cr Alloy Particle | [parts by mass] | — | — | 81.70 | 87.02 | 90.97 | 92.57 | — |
| | | | | volume % | 15.0 | 40.0 | 40.0 | 50.00 | 60.0 | 65.00 | — |
| | (Second Adhesive Resin Composition) | Epoxy Resin | Cresol Novolak Epoxy Resin | [parts by mass] | 5.16 | 2.29 | 1.70 | 1.20 | 0.84 | 0.69 | 9.34 |
| | | | Bisphenol A Epoxy Resin | [parts by mass] | 14.01 | 6.23 | 4.62 | 3.27 | 2.27 | 1.86 | 25.34 |
| | | Phenol Resin | Phenol Biphenylene Resin | [parts by mass] | 21.07 | 9.36 | 6.94 | 4.91 | 3.41 | 2.80 | 38.11 |
| | | Acrylic Resin | Modified Ethyl Acrylate-Butyl Acrylate-Acrylonitrile Copolymer | [parts by mass] | 14.49 | 6.44 | 4.78 | 3.38 | 2.34 | 1.92 | 26.22 |
| | | Additive | Thermosetting Catalyst | [parts by mass] | 0.55 | 0.24 | 0.18 | 0.13 | 0.09 | 0.07 | 0.99 |
| | | | Dispersant | [parts by mass] | 0.04 | 0.08 | 0.08 | 0.09 | 0.09 | 0.09 | — |
| Magnetic Layer | Magnetic Resin Composition | Soft Magnetic Particle | Fe—Si—Al Alloy Particle | [parts by mass] | 90.32 | 90.32 | 90.32 | 90.32 | 90.32 | 90.32 | 90.32 |
| | | | | volume % | 60.0 | 60.0 | 60.0 | 60.0 | 60.0 | 60.0 | 60.0 |
| | | Epoxy Resin | Cresol Novolak Epoxy Resin | [parts by mass] | 2.55 | 2.55 | 2.55 | 2.55 | 2.55 | 2.55 | 2.55 |
| | | Phenol Resin | Phenol Biphenylene Resin | [parts by mass] | 2.60 | 2.60 | 2.60 | 2.60 | 2.60 | 2.60 | 2.60 |
| | | Acrylic Resin | Modified Ethyl Acrylate-Butyl Acrylate-Acrylonitrile Copolymer | [parts by mass] | 4.16 | 4.16 | 4.16 | 4.16 | 4.16 | 4.16 | 4.16 |

TABLE 1-continued

| Ex. • Comp. Ex. | | | | Ex. 1 | Ex. 2 | Ex. 3 | Ex. 4 | Ex. 5 | Ex. 6 | Comp. Ex. 1 |
|---|---|---|---|---|---|---|---|---|---|---|
| | Additive | Thermosetting Catalyst | [parts by mass] | 0.09 | 0.09 | 0.09 | 0.09 | 0.09 | 0.09 | 0.09 |
| | | Dispersant | [parts by mass] | 0.09 | 0.09 | 0.09 | 0.09 | 0.09 | 0.09 | 0.09 |
| | Rheology Controlling Agent | | [parts by mass] | 0.19 | 0.19 | 0.19 | 0.19 | 0.19 | 0.19 | 0.19 |
| Evaluation | Push-in Properties of Coil Pattern to First Adhesive Layer | | | Excellent | Excellent | Excellent | Excellent | Excellent | Good | Excellent |
| | Magnetic Permeability of Second Module | | | 2 | 4 | 5 | 9 | 12 | 13 | 1 |
| | Inductance of Second Module [nH] | | | 25 | 35 | 41 | 50 | 58 | 62 | 19 |

The details of each of the components described in Table 1 were described in the following.

Ni—Zn ferrite particle: soft magnetic particle, manufactured by JFE FERRITE Co., Ltd., model number: KNI-109, average particle size of 1.5 μm.

Fe—Si—Cr alloy particle: soft magnetic particle, manufactured by NIPPON ATOMIZED METAL POWDERS, Inc., average particle size of 8 μm, trade name (iron alloy powders SFR-FeSiCr)

Fe—Si—Al alloy particle: soft magnetic particle, flat, coercive force in easy direction of magnetization of 3.9 (Oe), average particle size of 40 μm, average thickness of 1 μm Cresol novolak epoxy resin; epoxy equivalent of 199 g/eq., ICI viscosity (150° C.) of 0.4 Pa·s, specific gravity of 1.21, trade name. "KI-3040-4", manufactured by Tohto Kasei Co., Ltd.

Bisphenol A epoxy resin: epoxy equivalent: 180 g/eq., ICI viscosity (150° C.) of 0.05 Pa·s, specific gravity of 1.15, trade name: "EPIKOTE YL980", manufactured by Mitsubishi Chemical Corporation Phenol biphenylene resin: hydroxyl group equivalent of 203 g/eq., ICI viscosity (150° C.) of 0.05 Pa·s, specific gravity of 1.18, trade name: "MEH-7851SS", manufactured by MEWA PLASTIC INDUSTRIES, LTD.

Acrylic resin: carboxy group and hydroxy group-modified ethyl acrylate-butyl acrylate-acrylonitrile copolymer, weight average molecular weight of 900,000, specific gravity of 1.00, trade name: "TEISANRESIN SG-70L" (resin content ratio of 12.5 mass %), manufactured by Nagase ChemteX Corporation Thermosetting catalyst: 2-phenyl-1H-imidazole 4,5-dimethanol, specific gravity of 1.33, trade name: "CUREZOL 2PHZ-PW", manufactured by SHIKOKU CHEMICALS CORPORATION Dispersant: polyether phosphoric ester, acid value of 17, specific gravity of 1.03, trade name: "HIPLAAD ED152", manufactured by Kusumoto Chemicals, Ltd.

The adhesive resin composition was prepared in accordance with the description of Table 1.

(Evaluation)

Each of the items was evaluated as to each of the second modules 31 of Examples and Comparative Examples. The results are shown in Table 1.

1. Push-in Properties of Coil Pattern to First Adhesive Layer

The push-in properties of the coil pattern 5 with respect to the first adhesive layer 11 in the third step shown in FIG. 2H were evaluated based on the following criteria.

Excellent: the coil pattern 5 was surely pushed into the first adhesive layer 11.

Good: the coil pattern 5 was pushed into the first adhesive layer 11, but the yield was 50% or less.

2. Magnetic Permeability and Inductance

The magnetic permeability was measured with a one-turn method (frequency: 10 MHz) by using an impedance analyzer (manufactured by Keysight Technologies, "E4991B", 1 GHz model).

The inductance was measured with an impedance analyzer (manufactured by Keysight Technologies, "E4991B", 1 GHz model).

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

In the method for producing a module, a module used in wireless power transmission (wireless power feeding), wireless communication, a sensor, or the like is produced.

DESCRIPTION OF REFERENCE NUMERALS

1 First module
2 First peeling layer
3 Conductive layer
5 Coil pattern
9 Second peeling layer
11 First adhesive layer
12 Second adhesive layer
13 Adhesive layer
14 Supporting layer
18 Magnetic layer
31 Second module
33 Third module
34 Fourth module

The invention claimed is:

1. A method for producing a module comprising:
preparing a conductive layer disposed on one side surface in a thickness direction of a first peeling layer,
forming a conductive pattern from the conductive layer, transferring the conductive pattern from the first peeling layer onto a surface of a first adhesive layer and then peeling the first peeling layer, subsequently
pushing the conductive pattern into the first adhesive layer containing first magnetic particles and a first resin component to embed the conductive pattern, and
after the peeling of the first peeling layer, the method further comprises disposing a second peeling layer on a surface of the conductive pattern from which the first peeling layer was peeled,
pushing the conductive pattern into the first adhesive layer by press-bonding the second peeling layer with respect to the first adhesive layer, and
peeling the second peeling layer from the conductive pattern and the first adhesive layer.

2. The method for producing a module according to claim 1, wherein the first peeling layer includes a first pressure-sensitive adhesive layer and the conductive layer is disposed on the first pressure-sensitive adhesive layer.

3. The method for producing a module according to claim 1, wherein
the conductive layer is disposed at one side of the first peeling layer via a supporting layer to form a laminate, and
the first peeling layer is peeled from the supporting layer.

4. The method for producing a module according to claim 1, wherein
the conductive layer is etched.

5. The method for producing a module according to claim 1, wherein
the content ratio of the first magnetic particle in the first adhesive layer is 15 volume % or more and 60 volume % or less.

6. The method for producing a module according to claim 1, wherein
the first resin component is an epoxy resin, a phenol resin, and an acrylic resin.

7. The method for producing a module according to claim 1 further comprising:
disposing a magnetic layer containing second magnetic particles and a second resin component on a surface in the thickness direction of the first adhesive layer.

8. The method for producing a module according to claim 1 further comprising:
after pushing the conductive pattern into the first adhesive layer and peeling the first peeling layer, disposing a second adhesive layer containing the same first magnetic particles as in the first adhesive layer on a surface of the conductive pattern exposed by peeling of the first peeling layer to form a third adhesive layer including the first adhesive layer and the second adhesive layer.

9. The method for producing a module according to claim 3 further comprising:
after pushing the conductive pattern into the first adhesive layer and peeling the first peeling layer, disposing a second adhesive layer containing the same first magnetic particles as in the first adhesive layer on a surface of the conductive pattern exposed by peeling of the first peeling layer to form a third adhesive layer including the first adhesive layer and the second adhesive layer.

10. The method for producing a module according to claim 9, wherein
the content ratio of the first magnetic particle in the adhesive layer is 15 volume % or more and 60 volume % or less.

11. The method for producing a module according to claim 1, wherein
each of the first magnetic particles consists of at least one kind selected from iron and iron alloy.

12. The method for producing a module according to claim 9 further comprising:
disposing a magnetic layer containing second magnetic particles and a second resin component on both surfaces of the third adhesive layer.

13. The method for producing a module according to claim 7, wherein
the content ratio of the second magnetic particles in the magnetic layer is 40 volume % or more.

14. The method for producing a module according to claim 7, wherein
each particle of the second magnetic particles consist of at least one kind selected from iron and iron alloy.

15. The method for producing a module according to claim 7, wherein the second resin component is an epoxy resin, a phenol resin, and an acrylic resin.

* * * * *